(12) United States Patent
Fan et al.

(10) Patent No.: US 9,106,248 B1
(45) Date of Patent: Aug. 11, 2015

(54) ANALOG TO DIGITAL CONVERTER

(71) Applicant: Huawei Technologies Co., Ltd., Shenzhen (CN)

(72) Inventors: Mingjun Fan, Shanghai (CN); Liming Fang, Shanghai (CN); Yuan Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/607,282

(22) Filed: Jan. 28, 2015

(30) Foreign Application Priority Data

Jan. 28, 2014 (CN) .......................... 2014 1 0041918

(51) Int. Cl.
| | |
|---|---|
| H03M 1/34 | (2006.01) |
| H03M 1/12 | (2006.01) |
| H03M 7/16 | (2006.01) |
| H03M 1/00 | (2006.01) |
| H03M 1/36 | (2006.01) |

(52) U.S. Cl.
CPC . *H03M 1/12* (2013.01); *H03M 1/00* (2013.01); *H03M 1/365* (2013.01); *H03M 7/165* (2013.01)

(58) Field of Classification Search
CPC ......... H03M 1/00; H03M 1/365; H03M 1/12; H03M 7/165
USPC .......... 341/158, 159, 155, 156, 120, 160, 122
See application file for complete search history.

(56) References Cited

U.S. PATENT DOCUMENTS

| | | |
|---|---|---|
| 6,222,476 B1 | 4/2001 | Lee et al. |
| 8,872,691 B1 * | 10/2014 | Stepanovic ................... 341/158 |
| 2009/0267815 A1 | 10/2009 | Murden et al. |

FOREIGN PATENT DOCUMENTS

CN        102355265 A    2/2012

OTHER PUBLICATIONS

Partial English Translation and Abstract of Chinese Patent Application No. CN102355265A, Apr. 15, 2015, 3 pages.

* cited by examiner

*Primary Examiner* — Joseph Lauture
(74) *Attorney, Agent, or Firm* — Conley Rose, P.C.; Grant Rudolph; Nicholas K. Beaulieu

(57) ABSTRACT

The present invention relates to an analog to digital converter. The analog to digital converter includes comparing modules at multi levels, where a comparing module at each level includes a comparator and a metastable state determining unit. The comparator is configured to, when a previous-level comparing module is not in a metastable state, receive a first clock, a first input signal, and a second input signal, and compare the first input signal with the second input signal. The metastable state determining unit is configured to, when the previous-level comparing module is not in a metastable state, receive the first clock, generate a reference clock according to the first clock, and if a second clock that is output by the comparator is later than the reference clock, determine that the current-level comparing module is in a metastable state.

7 Claims, 8 Drawing Sheets

ANALOG TO DIGITAL CONVERTER

CROSS-REFERENCE TO RELATED APPLICATION

This application claims priority to Chinese Patent Application No. 201410041918.0, filed on Jan. 28, 2014, which is hereby incorporated by reference in its entirety.

TECHNICAL FIELD

The present invention relates to an analog to digital converter.

BACKGROUND

As the technology evolves, a speed of a comparator becomes increasingly high, and power consumption of a comparator is dynamic; therefore, an analog to digital converter that is based on a comparator structure becomes increasingly advantageous.

However, a comparator features metastability. When two extremely similar signals are input to the comparator, due to a limited amplification multiple of the comparator, the comparator cannot distinguish electrical levels of the two input signals for a long time, and therefore outputs an intermediate electrical level. In this case, a metastable state occurs. Once a metastable state occurs on a comparator, an analog to digital converter that is based on a comparator structure may become invalid or deteriorate in performance, and cannot operate normally.

SUMMARY

In view of this, the present invention provides an analog to digital converter. The analog to digital converter can still operate normally when a metastable state occurs on a comparator in the analog to digital converter.

According to a first aspect, an embodiment of the present invention provides an analog to digital converter, where the analog to digital converter includes comparing modules at multi levels, where a comparing module at each level includes a comparator and a metastable state determining unit, where the comparator is configured to, when a previous-level comparing module is not in a metastable state, receive a first clock, a first input signal, and a second input signal, and compare the first input signal with the second input signal; the metastable state determining unit is configured to, when the previous-level comparing module is not in a metastable state, receive the first clock, generate a reference clock according to the first clock, and if a second clock output by the comparator is later than the reference clock, determine that the comparator is in a metastable state, thereby determining that a current-level comparing module is in a metastable state; the metastable state determining unit is further configured to, when the previous-level comparing module is in a metastable state, determine that the current-level comparing module is in a metastable state, where the second clock is a clock obtained by delaying the first clock, and delay time from the first clock to the second clock is proportional to time of comparing, by the comparator, the first input signal with the second input signal; and the comparator is further configured to output a first electrical level when the previous-level comparing module is not in a metastable state and the current-level comparing module is in a metastable state, output a second electrical level when the previous-level comparing module is in a metastable state and the current-level comparing module is in a metastable state, and output a comparison result of the first input signal and the second input signal when the previous-level comparing module is not in a metastable state and the current-level comparing module is not in a metastable state, where the first electrical level and the second electrical level are mutually reverse electrical levels.

In a first possible implementation manner of the first aspect, the comparator includes a comparing circuit, a first multiplexer, a second multiplexer, and a third multiplexer, where a first input end of the comparing circuit receives the first input signal, a second input end of the comparing circuit is used to receive the second input signal, a third input end of the comparing circuit is connected to an output end of the first multiplexer, a selection end of the first multiplexer is used to receive a metastable state flag that is output by the previous-level comparing module, a first input end of the first multiplexer is used to receive the first clock, and a second input end of the first multiplexer is connected to a low electrical level; a first output end of the comparing circuit is connected to a first input end of the second multiplexer, a selection end of the second multiplexer is used to receive a metastable state flag that is output by the metastable state determining unit; a second input end of the second multiplexer is connected to an output end of the third multiplexer, an output end of the second multiplexer is used to output the comparison result of the first input signal and the second input signal, or the first electrical level, or the second electrical level, a selection end of the third multiplexer is used to receive the metastable state flag that is output by the previous-level comparing module, a first input end of the third multiplexer is connected to a high electrical level, and a second input end of the third multiplexer is connected to the low electrical level; a second output end of the comparing circuit is used to output the second clock; the metastable state determining unit includes a reference clock generating circuit, a D flip-flop, a first AND gate, a second AND gate, a third AND gate, a first OR gate, and a second OR gate, where the reference clock generating circuit is used to generate the reference clock according to the first clock; a first input end of the reference clock generating circuit is connected to an output end of the first AND gate, a first input end of the first AND gate is connected to the output end of the first multiplexer, and a second input end of the first AND gate is used to receive an enable signal of the reference clock generating circuit; an output end of the reference clock generating circuit is connected to a first input end of the first OR gate, a second input end of the first OR gate is connected to the second output end of the comparing circuit, a third input end of the first OR gate is connected to an output end of the second AND gate, a first input end of the second AND gate is used to receive the first clock, and a second input end of the second AND gate is used to receive the metastable state flag that is output by the previous-level comparing module; and an output end of the first OR gate is connected to a clock input end of the D flip-flop, a signal input end of the D flip-flop is connected to a second output end of the comparator, an inverting output end of the D flip-flop is connected to a first input end of the second OR gate, a second input end of the second OR gate is used to receive the metastable state flag that is output by the previous-level comparing module, an output end of the second OR gate is connected to a first input end of the third AND gate, a second input end of the third AND gate is used to receive the enable signal of the reference clock generating circuit, and an output end of the third AND gate is used to output the metastable state flag that is output by the current-level comparing module.

With reference to the first possible implementation manner of the first aspect, in a second possible implementation manner, the comparing circuit includes a first N-metal-oxide-semiconductor (NMOS) transistor, a second NMOS transistor, a third NMOS transistor, a first P-metal-oxide-semiconductor (PMOS) transistor, a second PMOS transistor, a first capacitor, a second capacitor, a NAND gate, a latch, and a preamplifier, where a source of the first NMOS transistor is connected to a power supply, a drain of the first NMOS transistor is connected to a connection point of a source of the second NMOS transistor and a source of the third NMOS transistor, a drain of the second NMOS transistor is connected to a drain of the first PMOS transistor, a source of the first PMOS transistor is grounded, the drain of the second NMOS transistor is further connected to a first end of the first capacitor, a second end of the first capacitor is grounded, a drain of the third NMOS transistor is connected to a drain of the second PMOS transistor, a source of the second PMOS transistor is grounded, the drain of the third NMOS transistor is further connected to a first end of the second capacitor, a second end of the second capacitor is grounded, the first end of the first capacitor is further connected to a first input end of the preamplifier, the first end of the second capacitor is further connected to a second input end of the preamplifier, the first output end of the preamplifier is connected to a first input end of the latch, a second output end of the preamplifier is connected to a second input end of the latch, a first output end of the latch is connected to a first input end of the NAND gate, and a second output end of the latch is connected to a second input end of the NAND gate; a gate of the second NMOS transistor is the first input end of the comparing circuit; a gate of the third NMOS transistor is the second input end of the comparing circuit; a gate of the first NMOS transistor, and a connection of a gate of the first PMOS transistor and a gate of the second PMOS transistor are third input ends of the comparing circuit; the first output end or the second output end of the latch is the first output end of the comparing circuit; and an output end of the NAND gate is the second output end of the comparing circuit.

With reference to the first possible implementation manner of the first aspect, in a third possible implementation manner, the reference clock generating circuit includes an NMOS transistor, a PMOS transistor, a capacitor, and a phase inverter, where a source of the NMOS transistor is connected to a power supply, a drain of the NMOS transistor is connected to a drain of the PMOS transistor, a source of the PMOS transistor is grounded, the drain of the NMOS transistor is further connected to a first end of the capacitor, a second end of the capacitor is grounded, and the drain of the NMOS transistor is further connected to an input end of the phase inverter; a connection point of a gate of the NMOS transistor and a gate of the PMOS transistor is the first input end of the reference clock generating circuit; and an output end of the phase inverter is the output end of the reference clock generating circuit.

With reference to the first possible implementation manner of the first aspect, in a fourth possible implementation manner, a second input end of the reference clock generating circuit is used to receive the first input signal, and a third input end of the reference clock generating circuit is used to receive the second input signal; and the reference clock generating circuit includes a first NMOS transistor, a second NMOS transistor, a third NMOS transistor, a PMOS transistor, a capacitor, and a phase inverter, where a source of the first NMOS transistor is connected to a power supply, a drain of the first NMOS transistor is connected to a connection point of a source of the second NMOS transistor and a source of the third NMOS transistor, a connection point of a drain of the second NMOS transistor and a drain of the third NMOS transistor is connected to a drain of the PMOS transistor, a source of the PMOS transistor is grounded, the drain of the PMOS transistor is further connected to a first end of the capacitor, a second end of the capacitor is grounded, and the drain of the PMOS transistor is further connected to an input end of the phase inverter; a connection point of a gate of the first NMOS transistor and a gate of the PMOS transistor is the first input end of the reference clock generating circuit; a gate of the second NMOS transistor is the second input end of the reference clock generating circuit; a gate of the third NMOS transistor is the third input end of the reference clock generating circuit; and an output end of the phase inverter is the output end of the reference clock generating circuit.

With reference to the first possible implementation manner, in a fifth possible implementation manner, the metastable state determining unit further includes a bypassing-delay circuit; where the bypassing-delay circuit is connected in series between the output end of the second AND gate and the third input end of the first OR gate.

With reference to the fifth possible implementation manner of the first aspect, in a sixth possible implementation manner, the bypassing-delay circuit includes an NMOS transistor, a PMOS transistor, a capacitor, and a phase inverter, where a source of the NMOS transistor is connected to a power supply, a drain of the NMOS transistor is connected to a drain of the PMOS transistor, a source of the PMOS transistor is grounded, the drain of the NMOS transistor is further connected to a first end of the capacitor, a second end of the capacitor is grounded, and the drain of the NMOS transistor is further connected to an input end of the phase inverter; a connection point of a gate of the first NMOS transistor and a gate of the PMOS transistor is a first input end of the bypassing-delay circuit; and an output end of the phase inverter is an output end of the bypassing-delay circuit.

By using the foregoing solution, when a metastable state occurs on a comparator at the $N^{th}$ level, the comparator at the $N^{th}$ level is forced to output 1 or 0. When the comparator at the $N^{th}$ level outputs 1, all comparators at levels following the $N^{th}$ level are forced to output 0; and when the comparator at the $N^{th}$ level outputs 0, all comparators at the levels following the $N^{th}$ level are forced to output 1, so that an analog to digital converter outputs 1000 . . . or 0111 . . . , starting from the comparator at the $N^{th}$ level, thereby ensuring that the analog to digital converter can still operate normally when a metastable state occurs on a comparator in the analog to digital converter.

DESCRIPTION OF EMBODIMENTS

To make the objectives, technical solutions, and advantages of the present invention clearer, the following further describes the present invention in detail with reference to the accompanying drawings. The described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
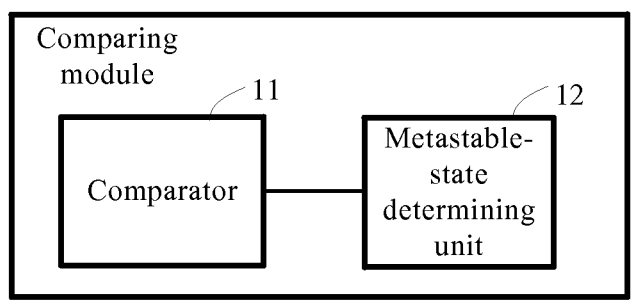
FIG. 1 is a schematic structural diagram of a comparing module in an analog to digital converter according to an embodiment of the present invention.

An embodiment of the present invention provides an analog to digital converter, where the analog to digital converter includes comparing modules at multi levels, and a comparing module at each level has a same structure. As shown in FIG. 1, FIG. 1 is a schematic structural diagram of a comparing module in an analog to digital converter according to an embodiment of the present invention.

The comparing module includes a comparator 11 and a metastable state determining unit 12.

The comparator 11 is configured to, when a previous-level comparing module is not in a metastable state, receive a first clock Ck(N), a first input signal Input(N)+, and a second input signal Input(N)−, and compare the first input signal Input (N)+ with the second input signal Input(N)−.

The metastable state determining unit 12 is configured to, when the previous-level comparing module is not in a metastable state, receive the first clock Ck(N), generate a reference clock Ck_MD(N+1) according to the first clock Ck(N), and if a second clock Ck_C(N+1) output by the comparator 11 is later than the reference clock Ck_MD(N+1), determine that the comparator 11 is in a metastable state, thereby determining that a current-level comparing module is in a metastable state.

The metastable state determining unit 12 is further configured to, when the previous-level comparing module is in a metastable state, determine that the current-level comparing module is in a metastable state.

The second clock Ck_C(N+1) is a clock after the first clock Ck(N) is delayed, and delay time from the first clock Ck(N) to the second clock Ck_C(N+1) is proportional to time of comparing, by the comparator 11, the first input signal Input(N)+ with the second input signal Input(N)−.

The comparator 11 is further configured to output a first electrical level when the previous-level comparing module is not in a metastable state and the current-level comparing module is in a metastable state, output a second electrical level when the previous-level comparing module is in a metastable state and the current-level comparing module is in a metastable state, and output a comparison result Output(N) of the first input signal Input(N)+ and the second input signal Input(N)− when the previous-level comparing module is not in a metastable state and the current-level comparing module is not in a metastable state.

The first electrical level and the second electrical level are mutually reverse electrical levels, that is, when the first electrical level is a high electrical level, the second electrical level is a low electrical level; and when the first electrical level is a low electrical level, the second electrical level is a high electrical level.

Specifically, because time of comparing, by the comparator, two input signals is inversely proportional to a difference between sizes of the two input signals, that is, a smaller difference between the sizes of the two input signals indicates longer time of comparing, when a difference between sizes of two given input signals cannot be determined by comparison within specified time, it is considered that a metastable state occurs on the comparator. In addition, in an analog to digital converter, when a difference between sizes of two input signals is very small, that is, when the difference is less than a least significant bit (LSB), a quantized value of a comparison result of the two input signal is either 10000 . . . or 01111 . . . , and the two results only differ by one LSB; therefore, impact on performance is also only one LSB to the maximum, which is generally acceptable for application of an analog to digital converter. According to a precision requirement of an analog to digital converter, it may be obtained that a minimum difference, which can be identified by a comparator at the $N^{th}$ level, between the sizes of the two input signals is Vcmin_N, and time required for the comparator to identify the minimum difference between the sizes of the two input signals is Tcmax_N. When the time required for the comparator to compare the two input signals is greater than Tcmax_N, it may be determined that the difference between the sizes of the two input signals is smaller than Vcmin_N of the comparator. Therefore, the metastable state determining unit 12 determines, according to the reference clock Ck_MD(N+1) generated by the first clock Ck(N), whether the time required for the comparator 11 to compare the difference between the sizes of the two input signals is greater than Tcmax_N, where delay time from the first clock Ck(N) to the reference clock Ck_MD(N+1) is not less than Tcmax_N. If the second clock Ck_C(N+1) output by the comparator 11 is later than the reference clock Ck_MD(N+1), it indicates that the time required for the comparator 11 to compare the difference between the sizes of the two input signals is greater than Tcmax_N, and then it is determined that the comparator 11 is in a metastable state, thereby determining that the current-level comparing module is in a metastable state.

In this case, as long as it is satisfied that a quantized output of the current-level comparator 11 is 1 and quantized outputs of all comparators at subsequent levels are 0, or a quantized output of the current-level comparator 11 is 0 and quantized outputs of all comparators at subsequent levels are 1, impact on overall performance of the analog to digital converter is performance loss of only one LSB precision to the maximum. Although precision of the analog to digital converter is slightly affected, it can be ensured that the analog to digital converter can still operate normally when a metastable state occurs on a comparator.

Figure 2:
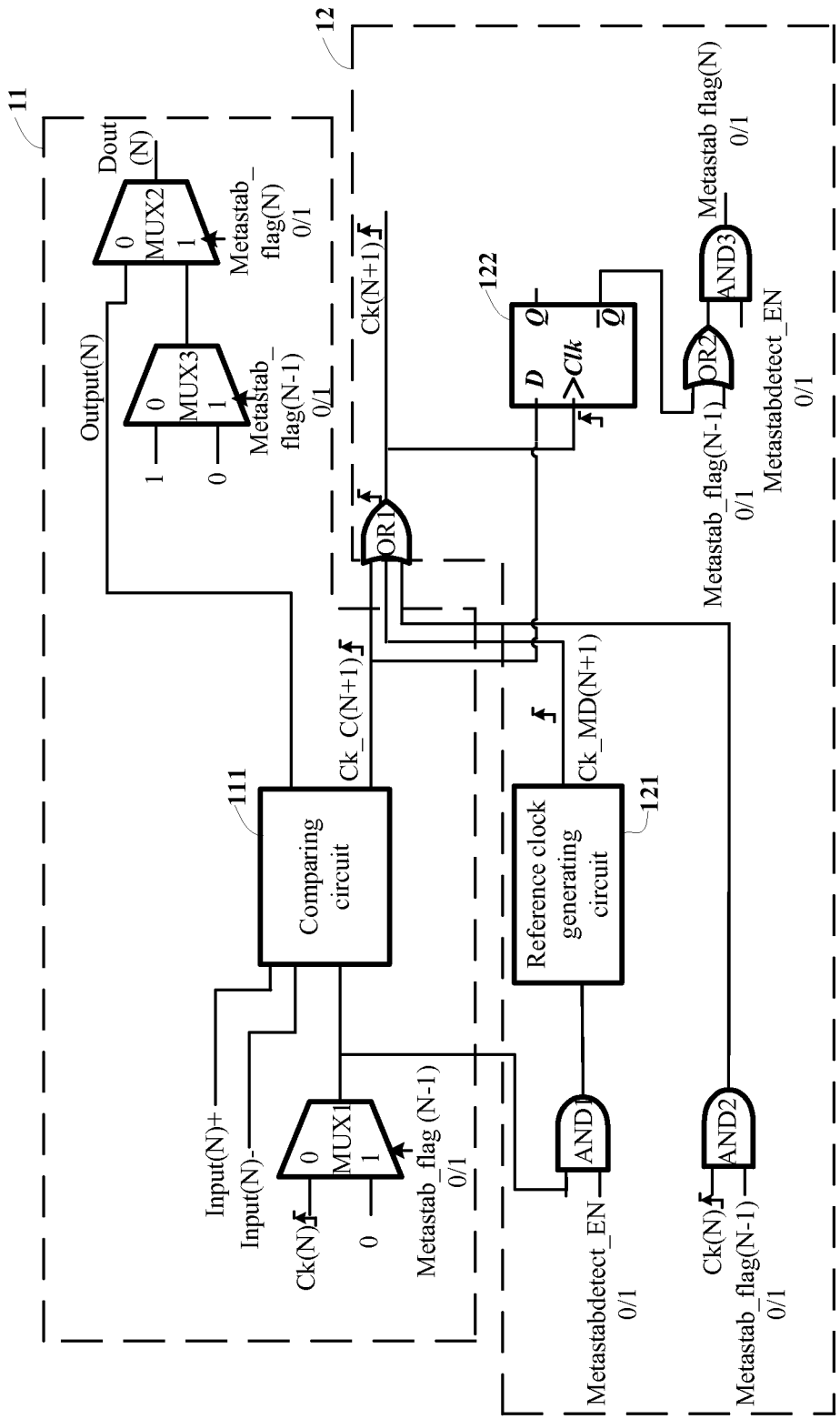
FIG. 2 is another schematic structural diagram of a comparing module in an analog to digital converter according to an embodiment of the present invention.

Further, to implement the foregoing functions, a specific structure of the comparator 11 and the metastable state determining unit 12 is shown in FIG. 2. FIG. 2 is another schematic structural diagram of a comparing module in an analog to digital converter according to an embodiment of the present invention.

The comparator 11 includes a comparing circuit 111, a first multiplexer MUX1, a second multiplexer MUX2, and a third multiplexer MUX3.

A first input end of the comparing circuit 111 receives the first input signal Input(N)+, a second input end of the comparing circuit 111 is used to receive the second input signal Input(N)−, a third input end of the comparing circuit 111 is connected to an output end of the first multiplexer MUX1, a selection end of the first multiplexer MUX1 is used to receive a metastable state flag Metastab_flag(N−1) that is output by the previous-level comparing module, a first input end of the first multiplexer MUX1 is used to receive the first clock Ck(N), and a second input end of the first multiplexer MUX1 is connected to a low electrical level; a first output end of the comparing circuit 111 is connected to a first input end of the second multiplexer MUX2, a selection end of the second multiplexer MUX2 is used to receive a metastable state flag Metastab_flag(N) that is output by the metastable state determining unit 12, a second input end of the second multiplexer MUX2 is connected to an output end of the third multiplexer MUX3, an output end of the second multiplexer MUX2 is used to output the comparison result Output(N) of the first input signal Input(N)+ and the second input signal Input(N)−, or the first electrical level, or the second electrical level, a selection end of the third multiplexer MUX3 is used to receive the metastable state flag Metastab_flag(N−1) that is output by the previous-level comparing module, a first input end of the third multiplexer MUX3 is connected to a high electrical level, and a second input end of the third multiplexer MUX3 is connected to the low electrical level; and a second output end of the comparing circuit 111 is used to output the second clock Ck_C(N+1).

The metastable state determining unit 12 includes a reference clock generating circuit 121, a D flip-flop 122, a first AND gate AND1, a second AND gate AND2, a third AND gate AND3, a first OR gate OR1, and a second OR gate OR2.

The reference clock generating circuit 121 is used to generate a reference clock according to the first clock Ck(N); a first input end of the reference clock generating circuit 121 is connected to an output end of the first AND gate AND1, a first input end of the first AND gate AND1 is connected to the output end of the first multiplexer MUX1, and a second input end of the first AND gate AND1 is used to receive an enable signal Metastabdetect_EN of the reference clock generating circuit 121; an output end of the reference clock generating circuit 121 is connected to a first input end of the first OR gate OR1, a second input end of the first OR gate OR1 is connected to the second output end of the comparing circuit 111, a third input end of the first OR gate OR1 is connected to an output end of the second AND gate AND2, a first input end of the second AND gate AND2 is used to receive the first clock Ck(N), and a second input end of the second AND gate AND2 is used to receive the metastable state flag Metastab_flag(N−1) that is output by the previous-level comparing module; and an output end of the first OR gate OR1 is connected to a clock input end of the D flip-flop 122, a signal input end of the D flip-flop 122 is connected to the second output end of the comparing circuit 111, an inverting output end of the D flip-flop 122 is connected to a first input end of the second OR gate OR2, a second input end of the second OR gate OR2 is used to receive the metastable state flag Metastab_flag(N−1) that is output by the previous-level comparing module, an output end of the second OR gate OR2 is connected to a first input end of the third AND gate AND3, a second input end of the third AND gate AND3 is used to receive the enable signal Metastabdetect_EN of the reference clock generating circuit 121, and an output end of the third AND gate AND3 is used to output the metastable state flag Metastab_flag(N) that is output by the current-level comparing module.

It can be known from the comparing module shown in FIG. 2 that, in a case in which a metastable state detection function is enabled, that is, Metastabdetect_EN=1, if a metastable state occurs on a comparator at a previous level, that is, Metastab_flag(N−1)=1, then Metastab_flag(N)=1. In this case, data output by the comparator Dout(N)=1. If no metastable state occurs on any comparator at a previous level, that is, Metastab_flag(N−1)=0, when a rising edge of CK_C(N+1) arrives earlier than that of CK_MD(N+1), Metastab_flag(N) is 0, where Dout(N) is Output(N) generated by a comparator; when the rising edge of CK_C(N+1) arrives later than that of CK_MD(N+1), Metastab_flag(N) is 1, where Dout(N)=0.

It may be understood that this embodiment of the present invention uses only an example in which an analog to digital converter includes the comparing module shown in FIG. 2. The first input end and the second input end of the third multiplexer MUX3 in the comparing module shown in FIG. 2 are interchangeable, that is, the first input end of the third multiplexer MUX3 is connected to a low electrical level, and the second input end of the third multiplexer MUX3 is connected to a high electrical level. That is, in a case in which the analog to digital converter includes the comparing module shown in FIG. 2, when a metastable state occurs on the comparator at the $N^{th}$ level, the analog to digital converter outputs 1000 . . . , starting from the comparator at the $N^{th}$ level; and in a case in which the first input end and the second input end of the third multiplexer MUX3 in the comparing module, shown in FIG. 2, of the analog to digital converter are interchanged, when a metastable state occurs on the comparator at the $N^{th}$ level, the analog to digital converter outputs 0111 . . . , starting from the comparator at the $N^{th}$ level.

Figure 3:
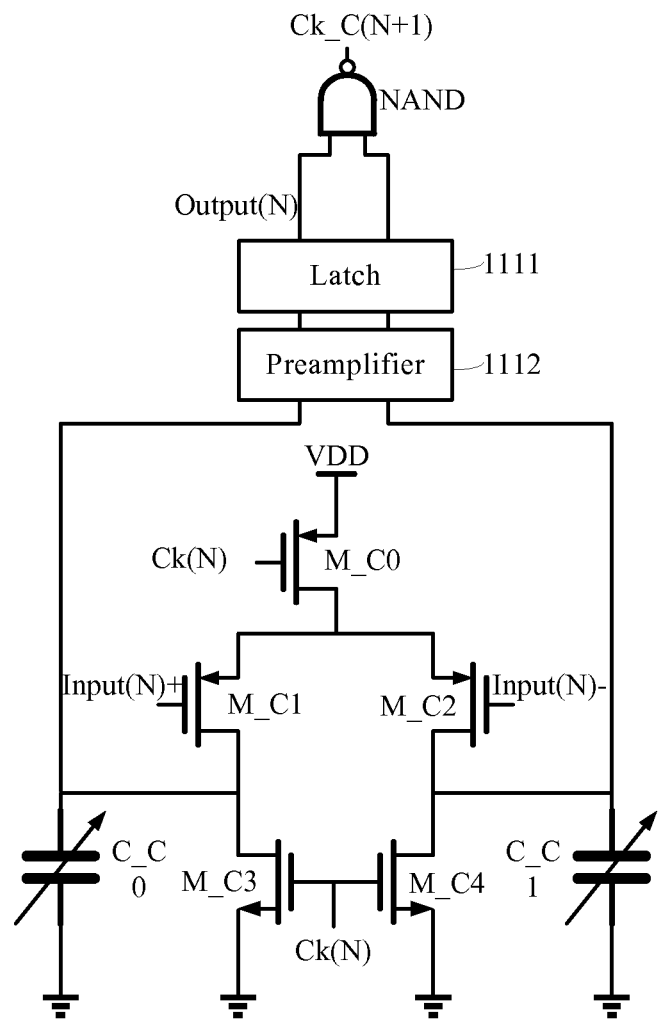
FIG. 3 is a schematic structural diagram of a comparing circuit according to an embodiment of the present invention.

Optionally, as shown in FIG. 3, the comparing circuit 111 includes a first NMOS transistor M_C0, a second NMOS transistor M_C1, a third NMOS transistor M_C2, a first PMOS transistor M_C3, a second PMOS transistor M_C4, a first capacitor C_C0, a second capacitor C_C1, a NAND gate NAND, a latch 1111, and a preamplifier 1112.

A source of the first NMOS transistor M_C0 is connected to a power supply, a drain of the first NMOS transistor M_C0 is connected to a connection point of a source of the second NMOS transistor M_C1 and a source of the third NMOS transistor M_C2, a drain of the second NMOS transistor M_C1 is connected to a drain of the first PMOS transistor M_C3, a source of the first PMOS transistor M_C3 is grounded, the drain of the second NMOS transistor M_C1 is further connected to a first end of the first capacitor C_C0, a second end of the first capacitor C_C0 is grounded, a drain of the third NMOS transistor M_C2 is connected to a drain of the second PMOS transistor M_C4, a source of the second PMOS transistor M_C4 is grounded, the drain of the third NMOS transistor M_C2 is further connected to a first end of the second capacitor C_C1, a second end of the second capacitor C_C1 is grounded, the first end of the first capacitor C_C0 is further connected to a first input end of the preamplifier 1112, the first end of the second capacitor C_C1 is further connected to a second input end of the preamplifier 1112, a first output end of the preamplifier 1112 is connected to a first input end of the latch 1111, a second output end of the preamplifier 1112 is connected to a second input end of the latch 1111, a first output end of the latch 1111 is connected to a first input end of the NAND gate NAND, and a second output end of the latch 1111 is connected to a second input end of the NAND gate NAND; a gate of the second NMOS transistor M_C1 is the first input end of the comparing circuit 111; a gate of the third NMOS transistor M_C2 is the second input end of the comparing circuit 111; a gate of the first NMOS transistor M_C0, and a connection point of a gate of the first PMOS transistor M_C3, and a gate of the second PMOS transistor M_C4 is third input ends of the comparing circuit 111; the first output end or the second output end of the latch 1111 is the first output end of the comparing circuit 111; and an output end of the NAND gate NAND is the second output end of the comparing circuit 111.

The first capacitor C_C0 and the second capacitor C_C1 are adjustable capacitors.

Figure 4:
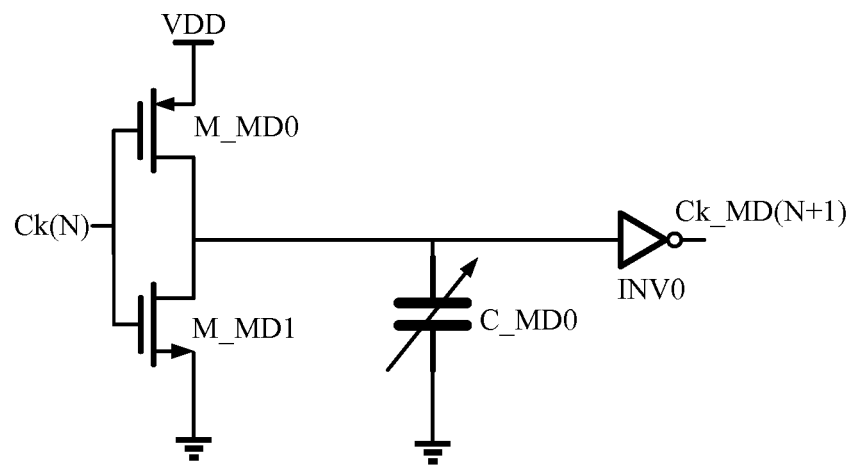
FIG. 4 is a schematic structural diagram of a reference clock generating circuit according to an embodiment of the present invention.

Optionally, as shown in FIG. 4, the reference clock generating circuit 121 includes an NMOS transistor M_MD0, a PMOS transistor M_MD1, a capacitor C_MD0, and a phase inverter INV0.

A source of the NMOS transistor M_MD0 is connected to a power supply, a drain of the NMOS transistor M_MD0 is connected to a drain of the PMOS transistor M_MD1, a source of the PMOS transistor M_MD 1 is grounded, the drain of the NMOS transistor M_MD0 is further connected to a first end of the capacitor C_MD0, a second end of the capacitor C_MD0 is grounded, and the drain of the NMOS transistor M_MD0 is further connected to an input end of the phase inverter INV0; a connection point of a gate of the NMOS transistor M_MD0 and a gate of the PMOS transistor M_MD1 is the first input end of the reference clock generating circuit 121; and an output end of the phase inverter INV0 is an output end of the reference clock generating circuit 121.

The capacitor C_MD0 is an adjustable capacitor, and delay time of a reference clock generated by the reference clock generating circuit 121 may be adjusted by adjusting a magnitude of the capacitor C_MD0.

In addition, a preamplifier may be connected in series between the capacitor C_MD0 and the phase inverter INV0.

Figure 5:
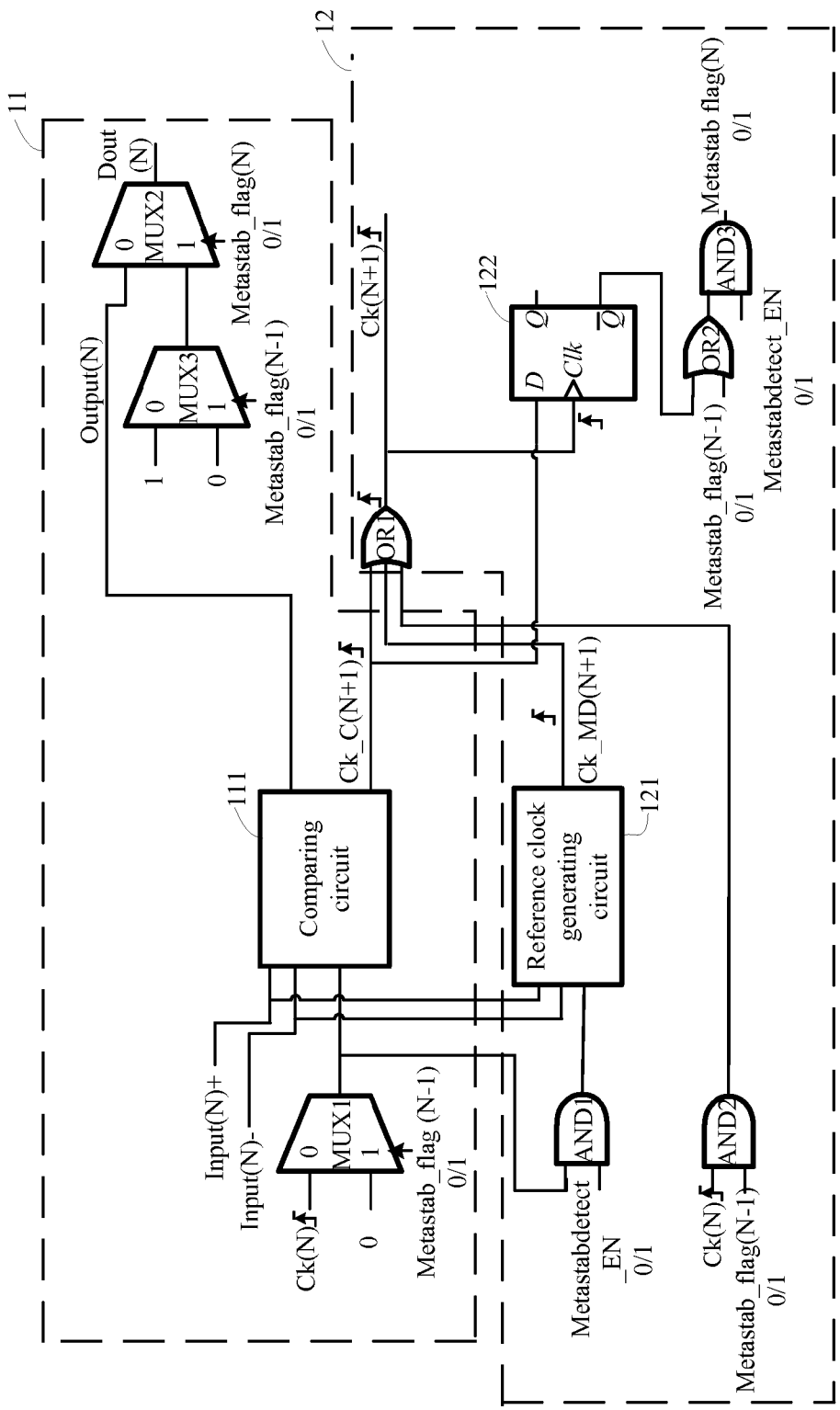
FIG. 5 is still another schematic structural diagram of a comparing module in an analog to digital converter according to an embodiment of the present invention.

Optionally, as shown in FIG. 5, the reference clock generating circuit 121 may further have a second input end and a third input end. The second input end of the reference clock generating circuit 121 is used to receive the first input signal Input(N)+; and the third input end of the reference clock generating circuit is used to receive the second input signal Input(N)−.

Figure 6:
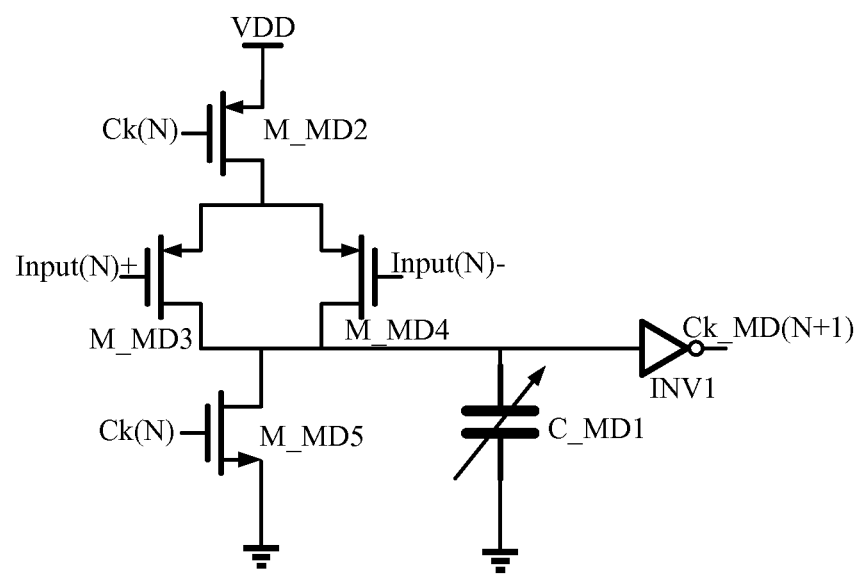
FIG. 6 is a schematic structural diagram of another reference clock generating circuit according to an embodiment of the present invention.

Correspondingly, as shown in FIG. 6 which is corresponding to FIG. 4, the reference clock generating circuit 121 includes a first NMOS transistor M_MD2, a second NMOS transistor M_MD3, a third NMOS transistor M_MD4, a PMOS transistor M_MD5, a capacitor C_MD1, and a phase inverter INV1.

A source of the first NMOS transistor M_MD2 is connected to a power supply, a drain of the first NMOS transistor M_MD2 is connected to a connection point of a source of the second NMOS transistor M_MD3 and a source of the third NMOS transistor M_MD4, a connection point of a drain of the second NMOS transistor M_MD3 and a drain of the third NMOS transistor M_MD4 is connected to a drain of the PMOS transistor M_MD5, a source of the PMOS transistor M_MD5 is grounded, the drain of the PMOS transistor M_MD5 is further connected to a first end of the capacitor C_MD1, a second end of the capacitor C_MD1 is grounded, and the drain of the PMOS transistor M_MD5 is further connected to an input end of the phase inverter INV1; a connection point of a gate of the first NMOS transistor M_MD2 and a gate of the PMOS transistor M_MD5 is the first input end of the reference clock generating circuit 121; a gate of the second NMOS transistor M_MD3 is the second input end of the reference clock generating circuit 121; a gate of the third NMOS transistor M_MD4 is the third input end of the reference clock generating circuit 121; and an output end of the phase inverter INV1 is an output end of the reference clock generating circuit 121.

The capacitor C_MD 1 is an adjustable capacitor, and the delay time of the reference clock generated by the reference clock generating circuit 121 may be adjusted by adjusting a magnitude of the capacitor C_MD 1.

In addition, a preamplifier may be connected in series between the capacitor C_MD1 and the phase inverter INV1.

Figure 7:
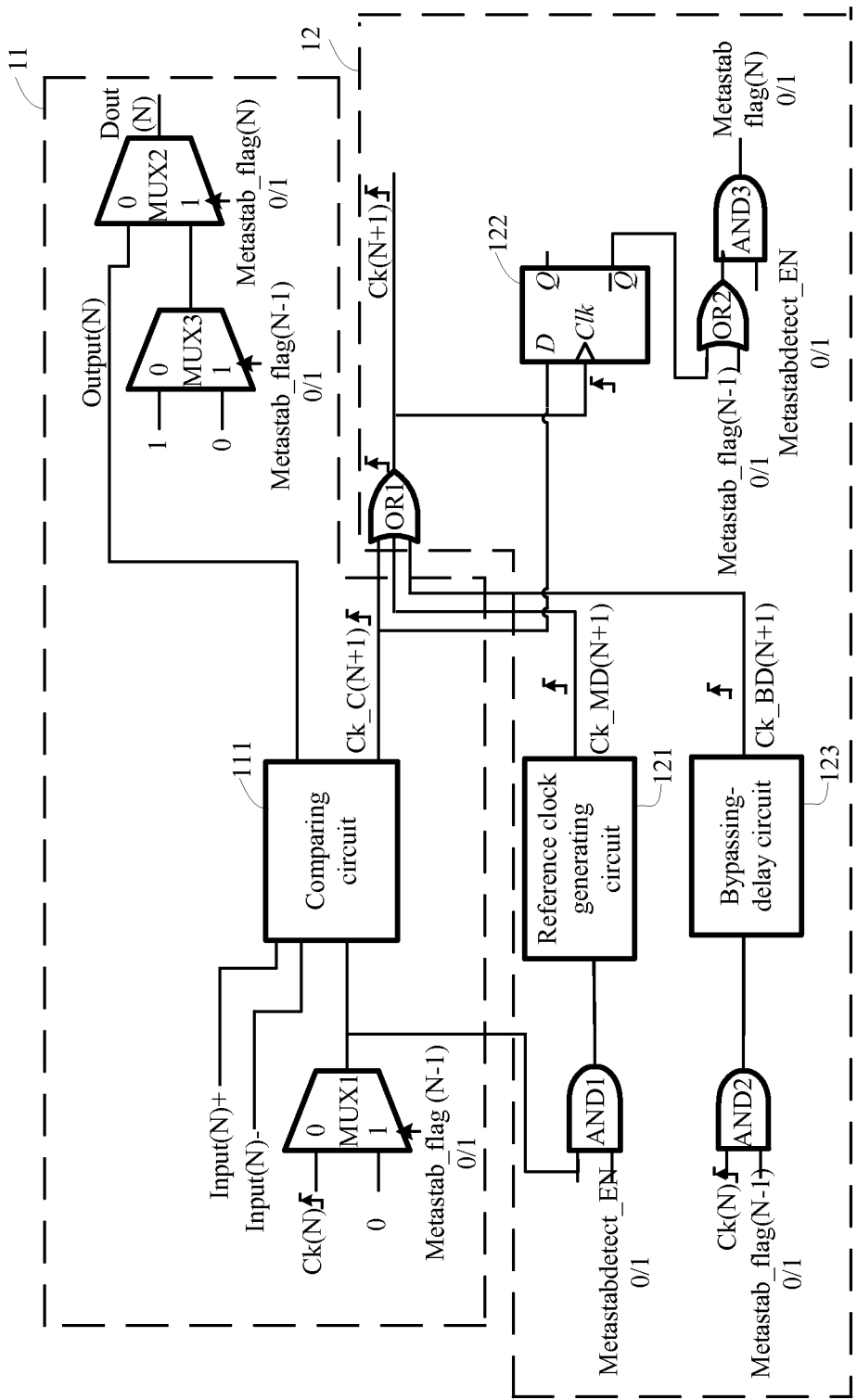
FIG. 7 is yet another schematic structural diagram of a comparing module in an analog to digital converter according to an embodiment of the present invention.

Optionally, as shown in FIG. 7, the metastable state determining unit 12 may further include a delay circuit 123 for bypassing, where the delay circuit 123 for bypassing is connected in series between the output end of the second AND gate AND2 and the third input end of the first OR gate OR1.

Figure 8:
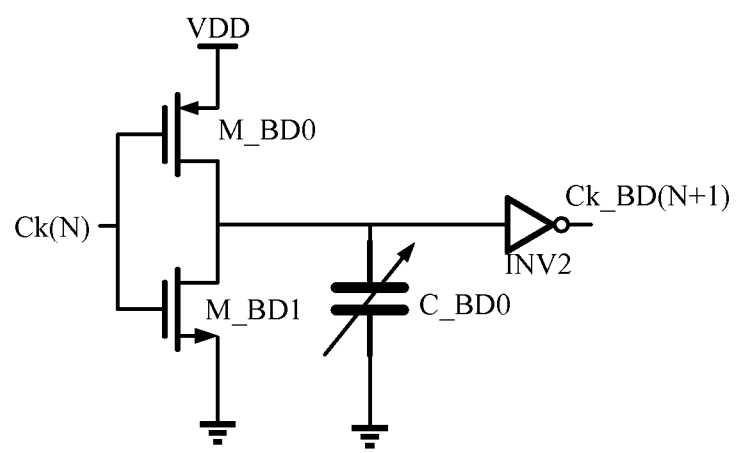
FIG. 8 is a schematic structural diagram of a bypassing-delay circuit according to an embodiment of the present invention.

As shown in FIG. 8, the delay circuit 123 for bypassing 123 includes an NMOS transistor M_BD0, a PMOS transistor M_BD1, a capacitor C_BD0, and a phase inverter INV2.

A source of the NMOS transistor M_BD0 is connected to a power supply, a drain of the NMOS transistor M_BD0 is connected to a drain of the PMOS transistor M_BD1, a source of the PMOS transistor M_BD1 is grounded, the drain of the NMOS transistor M_BD0 is further connected to a first end of the capacitor C_BD0, a second end of the capacitor C_BD0 is grounded, and the drain of the NMOS transistor M_BD0 is further connected to an input end of the phase inverter INV2; a connection point of a gate of the NMOS transistor M_BD0 and a gate of the PMOS transistor M_BD1 is a first input end of the delay circuit 123 for bypassing; and an output end of the phase inverter INV2 is an output end of the delay circuit 123 for bypassing.

The capacitor C_BD0 is an adjustable capacitor, and delay time of the delay circuit 123 for bypassing may be adjusted by adjusting a magnitude of the capacitor C_BD0.

In addition, a preamplifier may be connected in series between the capacitor C_BD0 and the phase inverter INV2.

By using the analog to digital converter provided by this embodiment of the present invention, when it is determined that a metastable state occurs on a comparator at the $N^{th}$ level, the comparator at the $N^{th}$ level is forced to output 1 or 0. When the comparator at the $N^{th}$ level outputs 1, all comparators at levels following the $N^{th}$ level are forced to output 0; and when the comparator at the $N^{th}$ level outputs 0, all comparators at levels following the $N^{th}$ level are forced to output 1, so that the analog to digital converter outputs 1000 . . . or 0111 . . . , starting from the comparator at the $N^{th}$ level, thereby ensuring that the analog to digital converter can still operate normally when a metastable state occurs on a comparator in the analog to digital converter.

In the foregoing specific embodiment, the objectives, technical solutions, and benefits of the present invention are further described in detail. It should be understood that the foregoing descriptions are merely specific embodiments of the present invention, but are not intended to limit the protection scope of the present invention. Any modification, equivalent replacement, or improvement made without departing from the spirit and principle of the present invention should fall within the protection scope of the present invention.

What is claimed is:

1. An analog to digital converter, comprising:
   comparing modules at multi levels,
   wherein a comparing module at each level comprises a comparator and a metastable state determining unit,
   wherein the comparator is configured to, when a previous-level comparing module is not in a metastable state, receive a first clock, a first input signal, and a second input signal, and compare the first input signal with the second input signal,
   wherein the metastable state determining unit is configured to, when the previous-level comparing module is not in the metastable state, receive the first clock, generate a reference clock according to the first clock, and when a second clock output by the comparator is later than the reference clock, determine that the comparator is in the metastable state, thereby determining that a current-level comparing module is in the metastable state,
   wherein the metastable state determining unit is further configured to, when the previous-level comparing module is in the metastable state, determine that the current-level comparing module is in the metastable state, wherein the second clock is a clock obtained by delaying the first clock, and delay time from the first clock to the second clock is proportional to time of comparing, by the comparator, the first input signal with the second input signal, wherein the comparator is further configured to output a first electrical level when the previous-level comparing module is not in the metastable state and the current-level comparing module is in the metastable state, output a second electrical level when the previous-level comparing module is in the metastable state and the current-level comparing module is in the metastable state, and output a comparison result of the first input signal and the second input signal when the previous-level comparing module is not in the metastable state and the current-level comparing module is not in the metastable state, and wherein the first electrical level and the second electrical level are mutually reverse electrical levels.

2. The analog to digital converter according to claim 1, wherein the comparator comprises a comparing circuit, a first multiplexer, a second multiplexer, and a third multiplexer, wherein a first input end of the comparing circuit receives the first input signal, a second input end of the comparing circuit is used to receive the second input signal, a third input end of the comparing circuit is connected to an output end of the first multiplexer, a selection end of the first multiplexer is used to receive a metastable state flag that is output by the previous-level comparing module, a first input end of the first multiplexer is used to receive the first clock, and a second input end of the first multiplexer is connected to a low electrical level, wherein a first output end of the comparing circuit is connected to a first input end of the second multiplexer, a selection end of the second multiplexer is used to receive a metastable state flag that is output by the metastable state determining unit, a second input end of the second multiplexer is connected to an output end of the third multiplexer, an output end of the second multiplexer is used to output the comparison result of the first input signal and the second input signal, or the first electrical level, or the second electrical level, a selection end of the third multiplexer is used to receive the metastable state flag that is output by the previous-level comparing module, a first input end of the third multiplexer is connected to a high electrical level, and a second input end of the third multiplexer is connected to the low electrical level, wherein a second output end of the comparing circuit is used to output the second clock wherein the metastable state determining unit comprises a reference clock generating circuit, a D flip-flop, a first AND gate, a second AND gate, a third AND gate, a first OR gate, and a second OR gate, wherein the reference clock generating circuit is used to generate the reference clock according to the first clock, wherein a first input end of the reference clock generating circuit is connected to an output end of the first AND gate, a first input end of the first AND gate is connected to the output end of the first multiplexer, and a second input end of the first AND gate is used to receive an enable signal of the reference clock generating circuit, wherein an output end of the reference clock generating circuit is connected to a first input end of the first OR gate, a second input end of the first OR gate is connected to the second output end of the comparing circuit, a third input end of the first OR gate is connected to an output end of the second AND gate, a first input end of the second AND gate is used to receive the first clock, and a second input end of the second AND gate is used to receive the metastable state flag that is output by the previous-level comparing module, and wherein an output end of the first OR gate is connected to a clock input end of the D flip-flop, a signal input end of the D flip-flop is connected to a second output end of the comparator, an inverting output end of the D flip-flop is connected to a first input end of the second OR gate, a second input end of the second OR gate is used to receive the metastable state flag that is output by the previous-level comparing module, an output end of the second OR gate is connected to a first input end of the third AND gate, a second input end of the third AND gate is used to receive the enable signal of the reference clock generating circuit, and an output end of the third AND gate is used to output the metastable state flag that is output by the current-level comparing module.

3. The analog to digital converter according to claim 2, wherein the comparing circuit comprises a first N-metal-oxide-semiconductor (NMOS) transistor, a second NMOS transistor, a third NMOS transistor, a first P-metal-oxide-semiconductor (PMOS) transistor, a second PMOS transistor, a first capacitor, a second capacitor, a NAND gate, a latch, and a preamplifier, wherein a source of the first NMOS transistor is connected to a power supply, a drain of the first NMOS transistor is connected to a connection point of a source of the second NMOS transistor and a source of the third NMOS transistor, a drain of the second NMOS transistor is connected to a drain of the first PMOS transistor, a source of the first PMOS transistor is grounded, the drain of the second NMOS transistor is further connected to a first end of the first capacitor, a second end of the first capacitor is grounded, a drain of the third NMOS transistor is connected to a drain of the second PMOS transistor, a source of the second PMOS transistor is grounded, the drain of the third NMOS transistor is further connected to a first end of the second capacitor, a second end of the second capacitor is grounded, the first end of the first capacitor is further connected to a first input end of the preamplifier, the first end of the second capacitor is further connected to a second input end of the preamplifier, a first output end of the preamplifier is connected to a first input end of the latch, a second output end of the preamplifier is connected to a second input end of the latch, a first output end of the latch is connected to a first input end of the NAND gate, and a second output end of the latch is connected to a second input end of the NAND gate, wherein a gate of the second NMOS transistor is the first input end of the comparing circuit, wherein a gate of the third NMOS transistor is the second input end of the comparing circuit, wherein a gate of the first NMOS transistor, and a connection point of a gate of the first PMOS transistor and a gate of the second PMOS transistor are third input ends of the comparing circuit, wherein the first output end or the second output end of the latch is the first output end of the comparing circuit, and wherein an output end of the NAND gate is the second output end of the comparing circuit.

4. The analog to digital converter according to claim 2, wherein the reference clock generating circuit comprises an N-metal-oxide-semiconductor (NMOS) transistor, a P-metal-oxide-semiconductor (PMOS) transistor, a capacitor, and a phase inverter, wherein a source of the NMOS transistor is connected to a power supply, a drain of the NMOS transistor is connected to a drain of the PMOS transistor, a source of the PMOS transistor is grounded, the drain of the NMOS transistor is further connected to a first end of the capacitor, a second end of the capacitor is grounded, and the drain of the NMOS transistor is further connected to an input end of the phase inverter, wherein a connection point of a gate of the NMOS transistor and a gate of the PMOS transistor is the first input end of the reference clock generating circuit, and wherein an output end of the phase inverter is the output end of the reference clock generating circuit.

5. The analog to digital converter according to claim 2, wherein a second input end of the reference clock generating circuit is used to receive the first input signal, and a third input end of the reference clock generating circuit is used to receive the second input signal, wherein the reference clock generating circuit comprises a first N-metal-oxide-semiconductor NMOS transistor, a second NMOS transistor, a third NMOS transistor, a P-metal-oxide-semiconductor (PMOS) transistor, a capacitor, and a phase inverter, wherein a source of the first NMOS transistor is connected to a power supply, a drain of the first NMOS transistor is connected to a connection point of a source of the second NMOS transistor and a source of the third NMOS transistor, a connection point of a drain of the second NMOS transistor and a drain of the third NMOS transistor is connected to a drain of the PMOS transistor, a source of the PMOS transistor is grounded, the drain of the PMOS transistor is further connected to a first end of the capacitor, a second end of the capacitor is grounded, and the drain of the PMOS transistor is further connected to an input end of the phase inverter, wherein a connection point of a gate of the first NMOS transistor and a gate of the PMOS transistor is the first input end of the reference clock generating circuit, wherein a gate of the second NMOS transistor is the second input end of the reference clock generating circuit, wherein a gate of the third NMOS transistor is the third input end of the reference clock generating circuit, and wherein an output end of the phase inverter is the output end of the reference clock generating circuit.

6. The analog to digital converter according to claim 2, wherein the metastable state determining unit further comprises a bypassing-delay circuit, wherein the bypassing-delay circuit is connected in series between the output end of the second AND gate and the third input end of the first OR gate.

7. The analog to digital converter according to claim 6, wherein the bypassing-delay circuit comprises an N-metal-oxide-semiconductor (NMOS) transistor, a P-metal-oxide-semiconductor (PMOS) transistor, a capacitor, and a phase inverter, wherein a source of the NMOS transistor is connected to a power supply, a drain of the NMOS transistor is connected to a drain of the PMOS transistor, a source of the PMOS transistor is grounded, the drain of the NMOS transistor is further connected to a first end of the capacitor, a second end of the capacitor is grounded, and the drain of the NMOS transistor is further connected to an input end of the phase inverter, wherein connection point of a gate of the NMOS transistor and a gate of the PMOS transistor is a first input end of the bypassing-delay circuit, and wherein an output end of the phase inverter is an output end of the bypassing-delay circuit.

* * * * *

UNITED STATES PATENT AND TRADEMARK OFFICE
CERTIFICATE OF CORRECTION

PATENT NO. : 9,106,248 B1  
APPLICATION NO. : 14/607282  
DATED : August 11, 2015  
INVENTOR(S) : Mingjun Fan, Liming Fang and Yuan Liu Page 1 of 1

It is certified that error appears in the above-identified patent and that said Letters Patent is hereby corrected as shown below:

On the title page item 65 should read

Prior Publication Data US2015/0214970 A1 July 30, 2015

Signed and Sealed this
Twenty-third Day of February, 2016

Michelle K. Lee
*Director of the United States Patent and Trademark Office*